United States Patent [19]
Unno et al.

[11] Patent Number: 5,184,176
[45] Date of Patent: Feb. 2, 1993

[54] PROJECTION EXPOSURE APPARATUS WITH AN ABERRATION COMPENSATION DEVICE OF A PROJECTION LENS

[75] Inventors: Yasuyuki Unno, Hadano; Seiji Orii; Masami Yonekawa, both of Atsugi, all of Japan

[73] Assignee: Canon Kabushiki Kaisha, Tokyo, Japan

[21] Appl. No.: 769,445

[22] Filed: Oct. 1, 1991

[30] Foreign Application Priority Data

Oct. 8, 1990 [JP] Japan .................................. 2-268346
Dec. 12, 1990 [JP] Japan .................................. 2-409879

[51] Int. Cl.⁵ .......................... G03B 27/68; G03B 27/42
[52] U.S. Cl. .......................................... 355/52; 355/53
[58] Field of Search ............................. 355/52, 53, 30

[56] References Cited

U.S. PATENT DOCUMENTS

| | | | |
|---|---|---|---|
| 4,666,273 | 5/1987 | Shimizu et al. | 355/554 |
| 4,887,283 | 12/1989 | Hosono | 378/35 |
| 5,008,702 | 4/1991 | Tanaka et al. | 355/52 |

FOREIGN PATENT DOCUMENTS

| | | |
|---|---|---|
| 1522285 | 8/1969 | Fed. Rep. of Germany . |
| 60-078454 | 5/1985 | Japan . |
| 1-250960 | 10/1989 | Japan . |
| 2-072362 | 3/1990 | Japan . |

Primary Examiner—Richard A. Wintercorn
Attorney, Agent, or Firm—Fitzpatrick, Cella, Harper & Scinto

[57] ABSTRACT

A projective exposure apparatus for imaging a pattern formed on an original onto a substrate at a predetermined magnification to form a pattern image on the substrate includes an original support member, a substrate support member, and a projection lens disposed between these support members for imaging the pattern onto the substrate. In the projection exposure apparatus, a partial deviation of positions of portions of the pattern image from regular positions are obtained in at least one of the directions along and perpendicular to a surface of the pattern image, and the partial deviation is eliminated by deforming at least one of the original and the substrate based on the thus obtained result.

11 Claims, 14 Drawing Sheets

F I G. 13
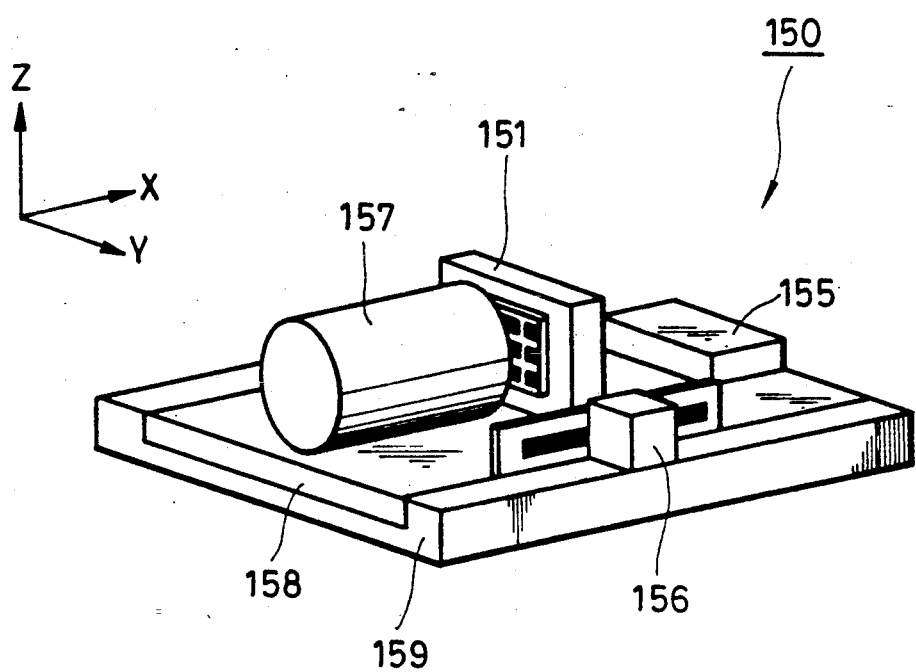

PROJECTION EXPOSURE APPARATUS WITH AN ABERRATION COMPENSATION DEVICE OF A PROJECTION LENS

BACKGROUND OF THE INVENTION

1. Field of the Invention

The present invention relates to a projection exposure apparatus, and particularly, to an exposure apparatus in which adverse influences of aberrations of a projection lens such as symmetrical distortion, curvature of field and the like of the projection lens to a high resolution are reduced or eliminated.

2. Related Background Art

In recent years, a projection type exposure apparatus has been widely used as an apparatus for producing a semiconductor integrated circuit in order to obtain a higher resolution, a higher exposure accuracy and a greater throughput.

In the projection exposure apparatus, there is provided a projection lens between a reticle (an original plate) and a silicon wafer (a substrate), and a circuit pattern formed on the reticle is imaged on the silicon wafer with a predetermined reduction ratio or reduced magnification (normally 1/5 or 1/10) through the projection lens. Thus, a pattern image which is a reduced image of the circuit pattern is formed on the silicon wafer. In a reduction projection type exposure apparatus, a step-and-repeat exposure system is generally adopted in which a silicon wafer is shifted each time one exposure has been completed and plural pattern images are arranged over an entire silicon wafer without any clearance by plural exposures, rather than a one-shot exposure system in which a pattern image is formed over an entire silicon wafer by a single exposure.

However, in order to cope with yet a further higher integration of a semiconductor integrated circuit, a limit to resolution which occurs in only using a reduction projection exposure apparatus to project a circuit pattern at a reduced ratio should be solved. So, it is required that the wavelength of an exposure light be made shorter and that an NA of a projection lens be made larger to improve the resolution. In this case, however, the following problems in turn arise due to a reduction of depth of focus resulting from the enlarged NA of a projection lens and due to a greater accuracy in alignment between a reticle and a silicon wafer resulting from a refined circuit pattern.

(1) Shift of a focal point of a projection lens:

The shift occurs because the projection lens absorbs part of the exposure light, and the displacement of the focal point increases as the exposure proceeds, as shown in FIG. 1. When the exposure starts at a time $t_0$, the displacement increases with time and a stationary state is reached at a time $t_1$. Then, if the exposure terminates at a time $t_2$, the displacement decreases with time and becomes zero at a time $t_3$. The displacement of the focal point would not be any trouble so long as its amount is small enough. But, if the displacement surpasses the range of a depth of locus, it becomes a great problem.

(2) Shift of an image magnification of a projection lens:

The shift also occurs since the projection lens absorbs part of the exposure light. As shown in FIG. 2, the displacement of the image magnification increases as the exposure proceeds. When the exposure starts at a time $t_0$, the displacement increases with time and a stationary state is reached at a time $t_1$. Then, if the exposure terminates at a time $t_2$, the displacement decreases with time and becomes zero at time $t_3$. Displacement of the image magnification would directly influence an arranging accuracy of circuit patterns on the wafer, and this becomes a great problem when a refined circuit pattern is depicted on the wafer.

(3) Symmetrical distortion of a projection lens:

The distortion also occurs since the projection lens absorbs part of the exposure light. The distortion could not be removed even if a projection lens of high performance is used which is designed to have no distortion at a stage of production thereof.

(4) Curvature of field of a projection lens:

Curvature of the field also occurs since the projection lens absorbs part of exposure light. When a wafer whose exposure area is enlarged to 20 mm×20 mm, it is difficult to maintain a best focused state over an entire exposure area of the wafer due to the shift of curvature of field of the projection lens. Thus, a limit to higher resolution occurs.

In a conventional projection exposure apparatus, the problems of (1) and (2) discussed above are solved by the following measures (a) and (b), and even if a focal point and an image magnification of the projection lens are greatly varied, these variations are corrected so that a circuit pattern on a reticle can be transferred on a silicon wafer under permissible conditions. But, the above-noted problems (3) and (4) are not yet be solved.

(a) Measures to correct a shift of a focal point:

A stage on which a silicon wafer is mounted is moved in a direction of an optical axis of the projection lens. Thus, a distance between the silicon wafer and the projection lens is adjusted according to the displacement of the focal point of the projection lens.

(b) Measures to correct a shift of an image magnification:

A sealed space is provided in a given space between lenses consisting of a projection lens. The air pressure in the sealed space is adjusted according to the shift of the image magnification of the projection lens (see Japanese Patent Laid-Open No. 60-078454). Or, a distance between the reticle and the projection lens, or distances between respective lenses consisting of the projection lens is adjusted according to the shift of the image magnification.

Therefore, in order to obtain a still further higher resolution in the conventional projection exposure apparatus, the problem concerning the symmetrical distortion of the projection lens as shown in FIGS. 3A and 3B or the curvature of field thereof must be solved.

In more detail, in a reduced projection exposure apparatus wherein only the correction of a shift of a focal point of a projection lens and the correction of an image magnification are performed, there is a problem that a pattern image 201 formed on a wafer as shown by a solid line in FIG. 3A has a barrel type distortion in which four sides of a square are curved outwardly, compared with a regular pattern image 200 as shown by dotted lines, when the projection lens involves a barrel type distortion which is a kind of symmetrical distortion. On the other hand, there is a problem that a pattern image 202 formed on a wafer as shown by a solid line in FIG. 3B has a reel type distortion in which four sides of a square are curved inwardly, compared with a regular pattern image 200 as shown by dotted lines, when the projection lens involves a reel type distortion which is also a kind of symmetrical distortion.

When the projection lens involves a curvature of field which is a kind of aberration, the pattern image partially shifts in a direction perpendicular to an exposure surface from a regular pattern image.

SUMMARY OF THE INVENTION

An object of this invention is to provide a projection exposure apparatus and a method in which influences of a partial shift of a pattern image on a substrate in at least one of the directions along and perpendicular to an exposure surface from a regular pattern image are reduced or eliminated to obtain a higher resolution.

Another object of this invention is to provide a projection exposure apparatus in which influences of a symmetrical distortion of a projection lens are reduced or eliminated to obtain a higher resolution.

Still another object of this invention is to provide a projection exposure apparatus in which influences of a curvature of field of a projection lens are reduced or eliminated to obtain a higher resolution.

According to one aspect of the present invention, a projection exposure apparatus in which a pattern formed on an original is imaged onto a substrate at a predetermined magnification to form a pattern image on the substrate includes first support means for supporting the original; second support means for supporting the substrate; a projection lens disposed between the first and second support means for imaging the pattern onto the substrate; obtaining means for obtaining a partial deviation of position of the pattern image from regular positions in at least one of the directions along and perpendicular to a surface of the pattern image; and eliminating means for eliminating the partial deviation based on an output of the obtaining means by deforming at least one of the original and the substrate.

According to another aspect of the present invention, a projection exposure apparatus in which a pattern formed on an original is imaged onto a substrate at a predetermined magnification to form a pattern image on the substrate includes first support means for supporting the original; second support means for supporting the substrate; a projection lens disposed between the first and second support means for imaging the pattern onto the substrate; deforming means for deforming the original in its surface direction; arithmetric means for calculating a deviation between an original geometric shape of the pattern formed on the original and a geometric shaped of the pattern image formed on the substrate; and control means for controlling the deforming means based on the deviation calculated by the arithmetric means so that the geometric shape of the pattern image coincide with the original geometric shape of the pattern.

According to a third aspect of the present invention, a projection exposure apparatus in which a pattern formed on an original is imaged onto a substrate at a predetermined magnification to form a pattern image on the substrate includes first support means for supporting the original; second support means for supporting the substrate; a projection lens disposed between the first and second support means for imaging the pattern onto the substrate; measuring means for measuring respective positions of image surfaces of plural detection marks formed on the original by use of an exposure light transmitted through the projection lens; curving means for curving an exposure surface of the substrate by displacing portions of the substrate when the detection marks are transferred in a direction perpendicular to an exposure surface of the substrate; and driving means for driving the curving means based on the respective positions of image surfaces for the detection marks measured by the measuring means.

According to a fourth aspect of the present invention, a method for imaging a pattern formed on an original onto a substrate at a predetermined magnification to form a pattern image on the substrate using a projection lens in a projection exposure apparatus includes the steps of: obtaining a partial deviation of positions of portions of the pattern image from regular positions in at least one of the directions along and perpendicular to a surface of the pattern image; eliminating the partial deviation by deforming at least one of the original and the substrate based on a result obtained in the obtaining step; and imaging the pattern on the original onto the substrate using an exposure light transmitted through the projection lens.

According to a fifth aspect of the present invention, a method for imaging a pattern formed on an original onto a substrate at a predetermined magnification to form a pattern image on the substrate using a projection lens in a projection exposure apparatus includes the steps of: measuring a manner of a change of a symmetrical distortion of the projection lens; calculating a deviation between an original geometric shape of the pattern formed on the original and a geometric shape of the pattern image formed on the substrate based on the manner of change of the symmetrical distortion of the projection lens measured in the measuring step; deforming the original in its surface direction based on the deviation calculated in the calculating step so that the geometric shape of the pattern image coincides with the original geometric shape of the pattern on the original; and imaging the pattern on the original onto the substrate using an exposure light transmitted through the projection lens.

According to a sixth aspect of the present invention, a method for imaging a pattern formed on an original onto a substrate at a predetermined magnification to form a pattern image on the substrate using a projection lens in a projection exposure apparatus includes the steps of: providing plural detection marks on the original; measuring respective positions of image surfaces of the plural detection marks formed on the original by use of an exposure light transmitted through the projection lens to detect a curvature of field of the projection lens; curving an exposure surface of the substrate by displacing portions of the substrate when the detection marks are transferred in a direction perpendicular to the exposure surface of the substrate based on the respective image surfaces of the detection marks measured in the measuring step to compensate for the curvature of field of the projection lens; and imaging the pattern on the original onto the substrate using the exposure light transmitted through the projection lens.

These advantages and other will be more readily understood in connection with the following detailed description, claims and drawing.

BRIEF DESCRIPTION OF THE DRAWINGS

FIG. 13 is a perspective view of a light receiving device of the third embodiment.

DETAILED DESCRIPTION OF THE PREFERRED EMBODIMENT

Figure 4:
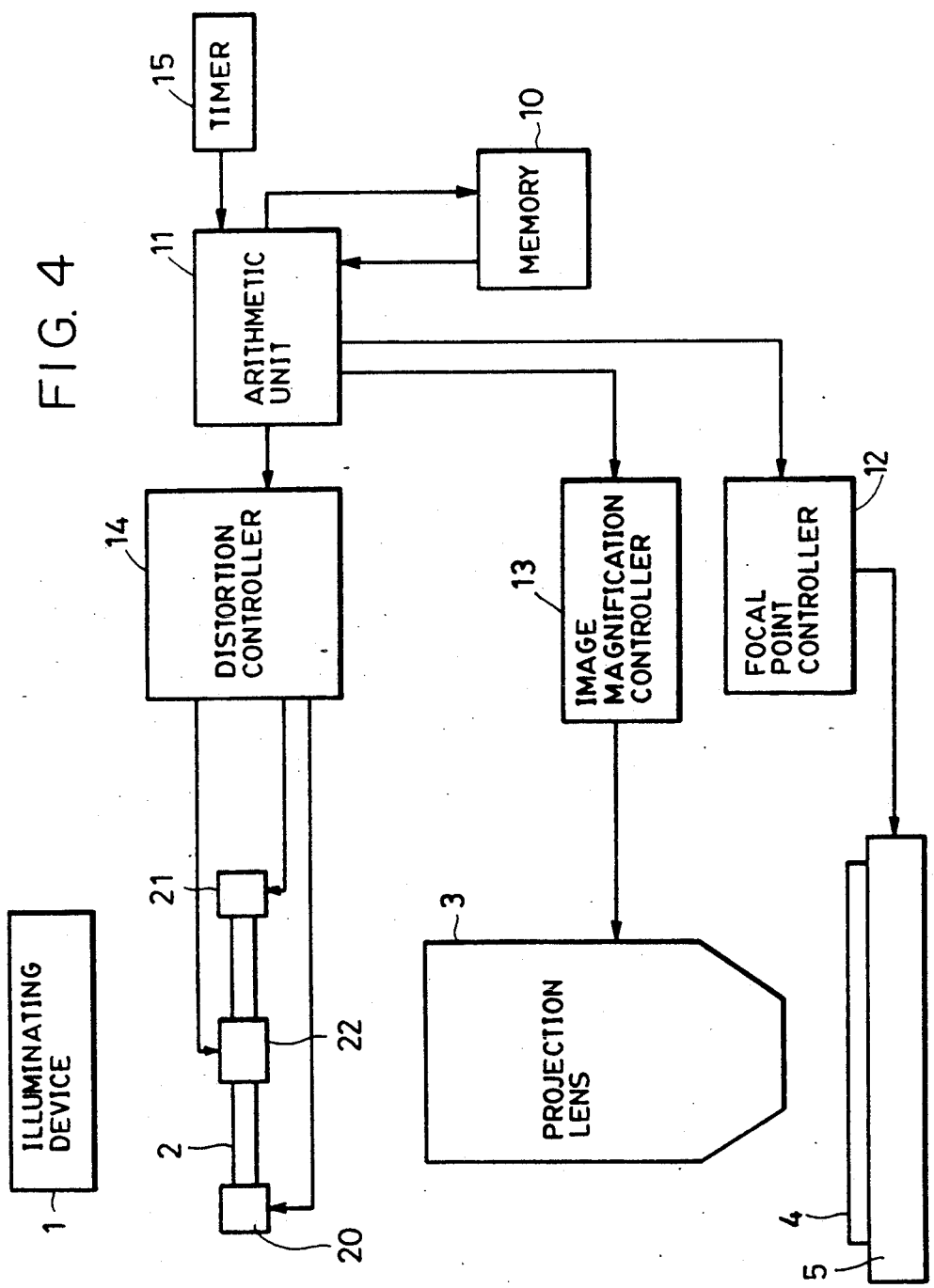
FIG. 4 is a schematic diagram of a first embodiment of a reduced projection exposure apparatus according to the present invention.

FIG. 4 shows a first embodiment of a projection exposure apparatus according to the present invention. This figure is a schematic view of a reduced projection type exposure apparatus for producing a semiconductor integrated circuit.

Figure 5:
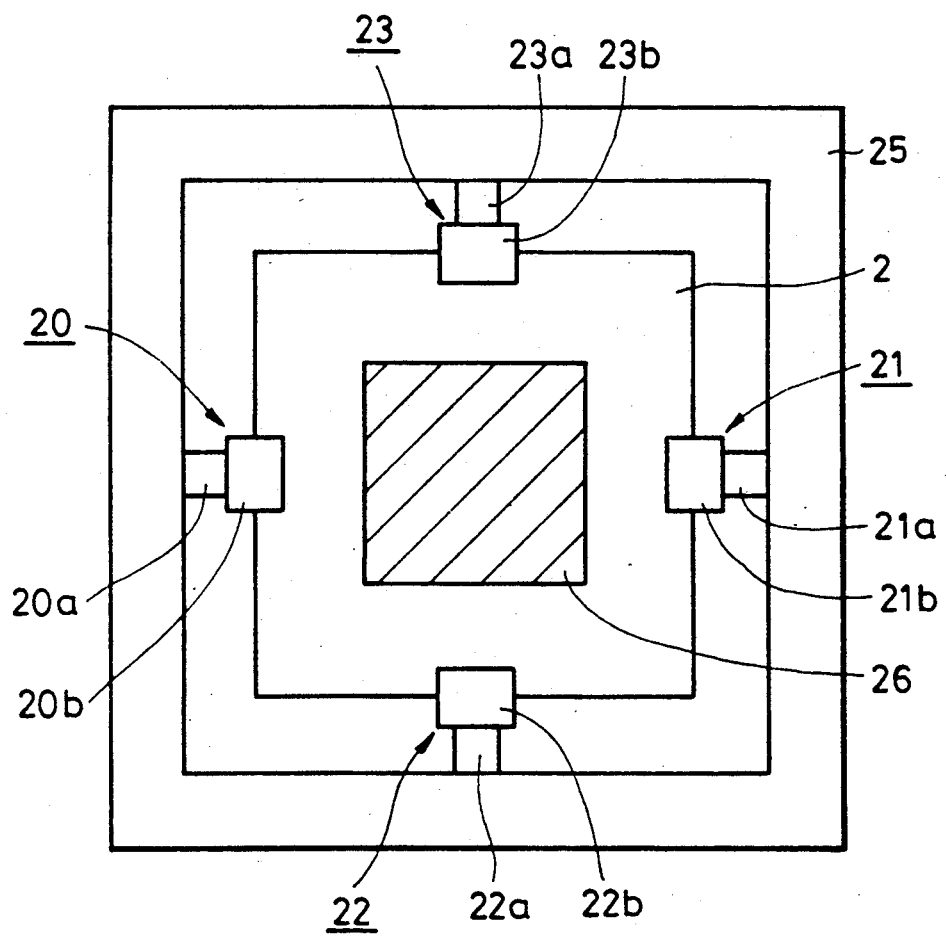
FIG. 5 is a plan view illustrating a method for fixing a reticle by driving devices in the first embodiment of the present invention.

In the first embodiment, there are provided, as shown in FIG. 4, an illuminating device 1 for emitting an exposure light of ultraviolet light, a reticle 2 having thereon a circuit pattern 26 and having a desired shape (herein, a square as shown in FIG. 5 for the convenience of explanation), a silicon wafer 4 on which a pattern image of a reduced image of the circuit pattern 26 is to be formed, a projection lens 3 for imaging the circuit pattern 26 onto the silicon wafer 4 at a predetermined reduction ratio, a stage 5 on which the silicon wafer 4 is mounted and which controls the position of the silicon wafer 4, a focal point controller 12 for controlling a correction of a shift of a focal point of the projection lens 3, and an image magnification controller 13 for controlling a correction of a shift of an image magnification of the projection lens 3.

The illuminating device 1 includes a light source for radiating light such as ultraviolet light, a shutter device, a condenser lens and the like. The reticle 2 and the silicon wafer 4 are disposed opposing each other in an optical axis of the exposure light radiated from the illuminating device 1. The projection lens 3 is disposed between the reticle 2 and the silicon wafer 4. The focal point controller 12 moves the stage 5 up and down according to a control signal for correcting the position a focal point output from an arithmetic or processing unit 11 explained below. The image magnification controller 13 adjusts an air pressure in a sealed space provided in the projection lens 3 according to a control signal for correcting the image magnification output from the arithmetic unit 11.

In the first embodiment, there are further provided four driving devices 20-23 which are respectively means for deforming the reticle 2 in its surface direction, the arithmetic unit 11 which comprises means for calculating deviations between an original geometric shape (square) of the circuit pattern 26 formed on the reticle 2 and a geometric shape of a pattern image formed on the silicon wafer 4, and a distortion controller 14 which comprises means for controlling four driving devices 20-23 to cause the geometric shape of the pattern coincide with the original geometric shape of the circuit pattern 26.

The arithmetic unit 11 includes a memory 10 for storing first data which is obtained beforehand by measuring a relationship between a symmetrical distortion of the projection lens 3 and time lapsed from a start of exposure, and a timer 15 for measuring the time from the start of exposure. The first data is read out from the memory 10 by inputting into the memory 10 the time e measured by the timer 15. Then, the unit 11 obtains the deviation based on the thus read first data, and generates the control signal for correcting the distortion.

Figure 1:
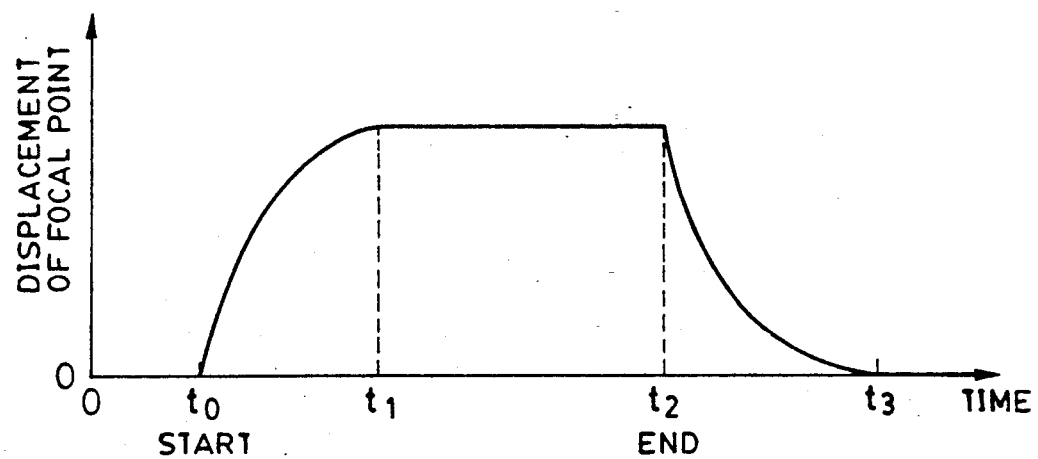
FIG. 1 is a representation illustrating a displacement with time of a focal point of a projection lens in a projection exposure apparatus.
Figure 2:
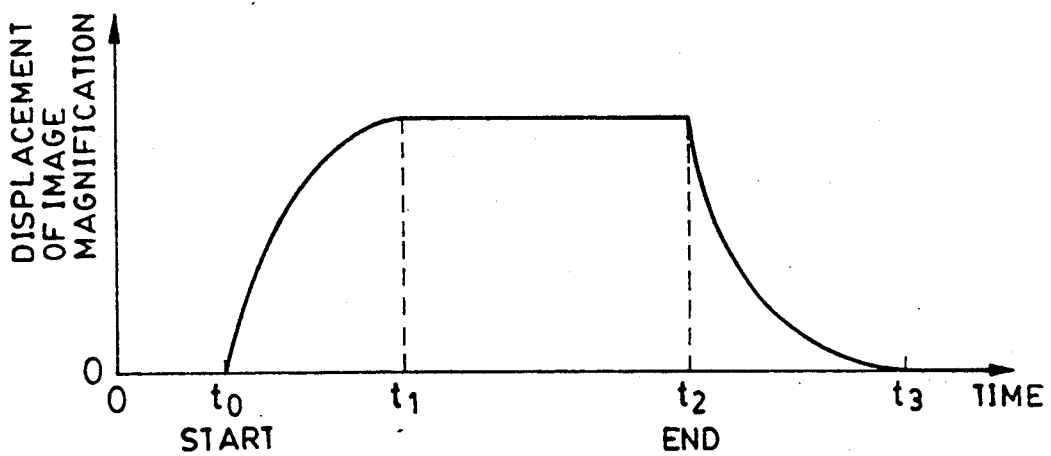
FIG. 2 is a representation illustrating a displacement with time of an image magnification of a projection lens in a projection exposure apparatus.

Further, the memory 10 stores second and third data which are obtained beforehand by measuring displacements with time of the focal point and the image magnification of the projection lens 3 (see FIGS. 1 and 2). The arithmetic unit 11 reads the second and third data by inputting into the memory 10 the time from the start of exposure measured by the timer 15. The unit 11 generates the control signal for correcting a focal point and the control signal for correcting an image magnification based on the thus read second and third data.

As shown in FIG. 5, four driving devices 20-23 are fixed to central portions of four sides of the reticle 2. The driving devices 20-23 are respectively composed of expansible portions 20a-23a whose expansion or shrinkage amounts are controlled by the control signals from the distortion controller 14 and which consist of piezoelectric elements, and stationary portions 20b-23b for fixing the reticle 2. One end of each expansible portion 20a-23a is fixed to a support frame 25 made of a material of high rigidity. The other end of each expansible portion 20a-23a is fixed to each stationary portion 20b-23b.

Figure 6:
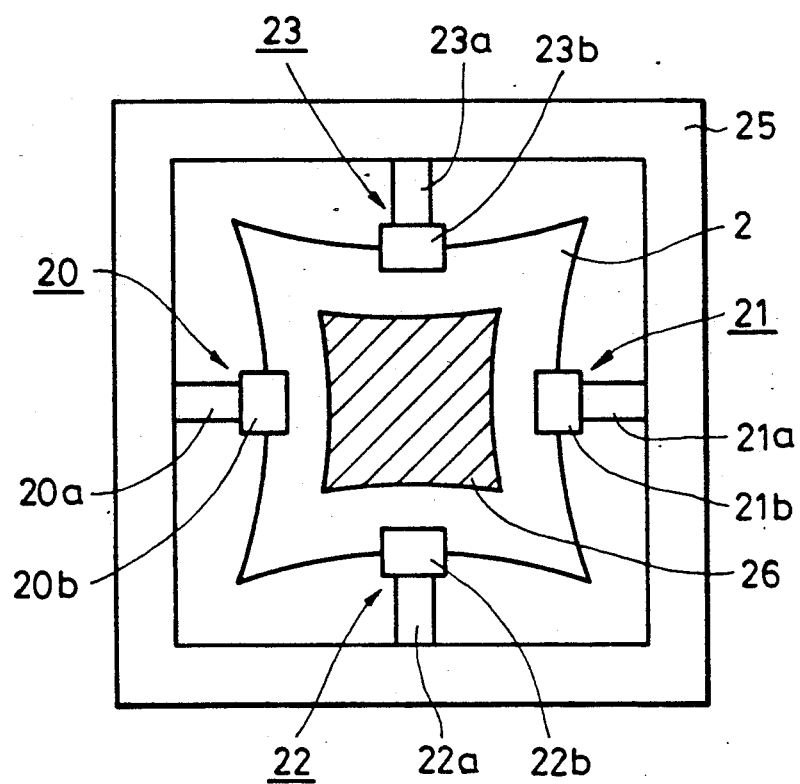
FIG. 6 is a plan view illustrating a reticle and a circuit pattern deformed when expandable portions of driving devices are extended in the first embodiment of the present invention.
Figure 7:
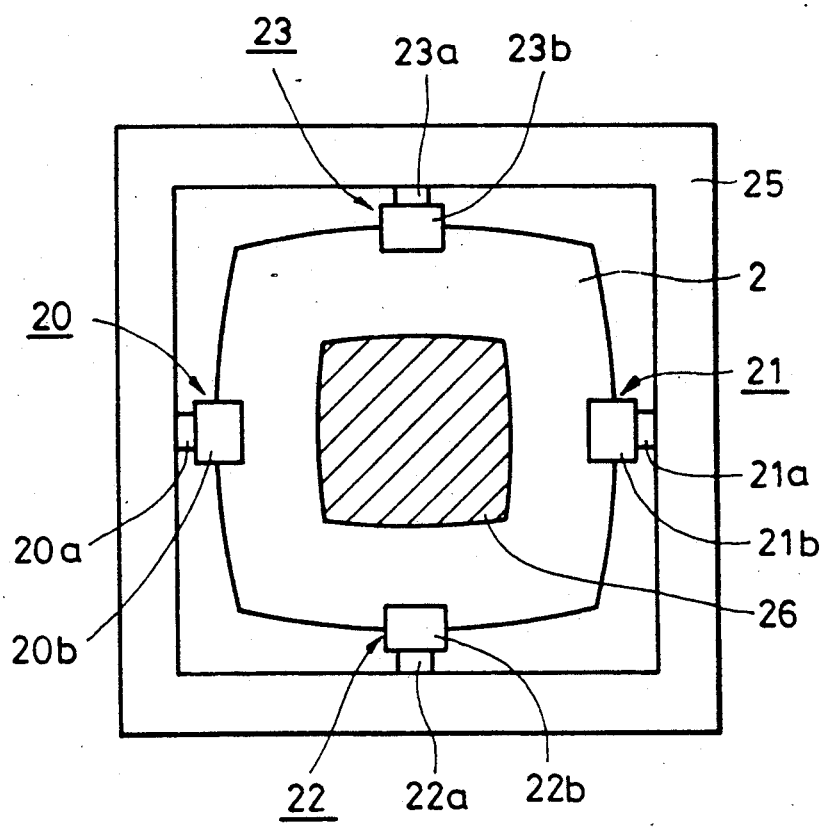
FIG. 7 is a plan view illustrating a reticle and a circuit pattern deformed when expandable portions of driving devices are reduced in the first embodiment of the present invention.

Therefore, as shown in FIGS 6 and 7, the reticle 2 is deformed inward in its surface direction by outputting the control signal from the distortion controller 14 to the expansible portion 20a-23a of each driving device 20-23. If the expansible portions 20a-23a are extended by an equal length according to the control signal, the reticle 2 is deformed to a reel shape as shown in FIG. 6. On the other hand, if the expansible portions 20a-23a are reduced by an equal length according to the control signal, the reticle 2 is deformed to a barrel shape as shown in FIG. 7. At this time, the square circuit pattern 26 on the reticle 2 shown by hatchings in FIG. 5 is also deformed inwardly or outwardly according to the deformation of the reticle 2 as shown in FIGS. 6 and 7.

Next, the operation of the first embodiment will be explained.

The exposure light (ultraviolet light) radiated from the illuminating device 1 illuminates the reticle 2 uniformly, and the exposure light applied to a portion on which the circuit pattern 26 is formed transmits through the reticle 2, while remaining exposure light is reflected by the reticle 2. The transmitted exposure light is reduction-projected by the projection lens 3 at a predetermined reduction ratio (normally 1/5 or 1/10). On the exposure surface of the silicon wafer 4, a resist which is to be chemically changed by the exposure light is uniformly coated. Therefore, the resist on a portion on which the transmitted exposure light applied is subjected to chemical reaction, so that the circuit pattern 26 is transferred onto the silicon wafer 4. Thus, the pattern image which is reduced from the circuit pattern 26 at the predetermined reduction ratio is formed on the wafer 4.

In the reduced projection exposure apparatus of the first embodiment, the displacement of the focal point, the shift of the image magnification and the symmetrical distortion of the projection lens 3 arise. The degradation of resolution due to those factors are prevented in this embodiment in the following manner.

(1) Preventing of adverse influences due to displacement of a focal point:

When the exposure is started, the arithmetic unit 11 inputs time elapsed from the start of exposure measured by the timer 15 into the memory 10 and the second data stored in the memory 10 (the shift with time from the start of exposure of the focal point of the projection lens 3 obtained by measurement) is read. Then, the focal point correction control signal produced based on the thus read second data is output to the focal point control device 12. The focal point control device 12 moves the stage 5 up and down based on the focal point correction control signal, and adjusts the distance between the projection lens 3 and the stage 5 according to the shift of the focal point of the projection lens 3.

(2) Prevention of adverse influences due to shift of an image magnification:

When the exposure is started, the arithmetic unit 11 inputs time elapsed from the start of exposure measured by the timer 15 into the memory 10 and the third data stored in the memory 10 (the shift with time from the start of exposure of the image magnification of the projection lens 3 obtained by measurement) is read. Then, the image magnification correction control signal produced based on the thus read third data is output to the image magnification control device 13. The image magnification control device 13 changes the pressure of air in the sealed space provided in the projection lens 3 based on the image magnification correction control signal, and adjusts the pressure of air in the sealed space according to the shift of the image magnification of the projection lens 3.

Figure 3A:
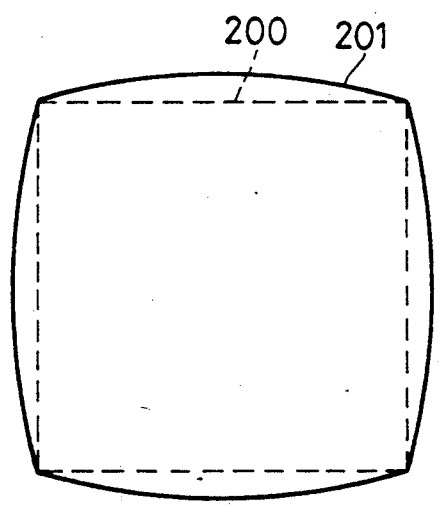
FIG. 3A is a plan view illustrating a deformed pattern image due to a barrel type distortion of a projection lens.
Figure 3B:
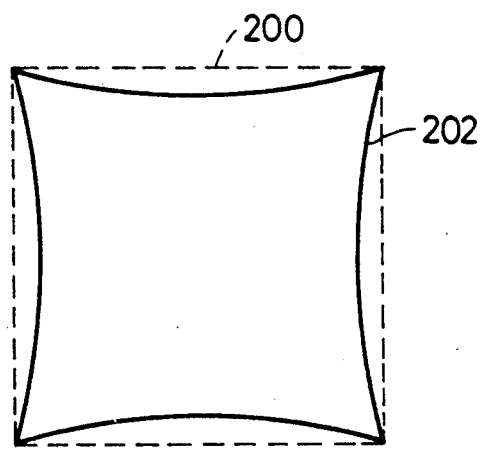
FIG. 3B is a plan view illustrating a deformed pattern image due to a reel type distortion of a projection lens.

(3) Prevention of adverse influences die to symmetrical distortion:

When the exposure is started, the arithmetric unit 11 inputs time elapsed from the start of exposure measured by the timer 15 into the memory 10 and the first data stored in the memory 10 (the relationship between time from the start of exposure and the symmetrical distortion of the projection lens 3 obtained by measurement) is read. Then, the distortion correction control signal produced based on the thus read first data is output to the distortion control device 14. The distortion control device 14 outputs control signals to the respective driving devices 20-23 according to the distortion correction control signal, and deforms the reticle 2 in its surface direction according to the symmetrical distortion of the projection lens 3. More in particular, the arithmetic unit 11 calculates from the first data read out from the memory 10 the deviation between the original geometric shape (square) of the circuit pattern 26 formed on the reticle 2 and the geometric shape of the pattern image formed on the silicon wafer 4. If a barrel type distortion of the pattern image due to the barrel type distortion of the projection lens 3 (see FIG. 3A) is confirmed, the arithmetic unit 11 produces a distortion correction control signal for instructing that the reticle 2 be made reel-shaped as shown in FIG. 6. The distortion control device 14 which receives the thus produced distortion correction control signal outputs control signals to the respective driving devices 20-23 for extending the expansible portions 20a-23a by predetermined amounts. On the other hand, if the deviation is calculated based on the first data read from the memory 10 and the reel type distortion of the pattern image due to the reel type distortion of the projection lens 3 (see FIG. 3B) is confirmed, the arithmetic unit 11 produces a distortion correction control signal for instructing that the reticle 2 be made barrel-shaped as shown in FIG. 7. the distortion control device 14 which receives the thus produced distortion correction control signal outputs control signals to the respective driving devices 20-23 for shrinking the expansible portions 20a-23a by predetermined amounts.

As a result, in this embodiment, even when the barrel-type or reel-type distortion of the pattern image formed on the silicon wafer 4 is created due to the symmetrical distortion of the projection lens 3, the reticle 2 can be deformed in its surface direction and the circuit pattern 26 formed on the reticle 2 can be deformed so that the distortion of the pattern image is eliminated. Thus, adverse influences due to the distortion of the pattern image formed on the silicon wafer 4 can be prevented.

Therefore, in the reduced projection exposure apparatus of the first embodiment, degradation of resolution due to a symmetrical distortion of the projection lens 3 as well as that due to shifts of a focal point of the projection lens 3 and an image magnification thereof can be prevented.

Figure 8:
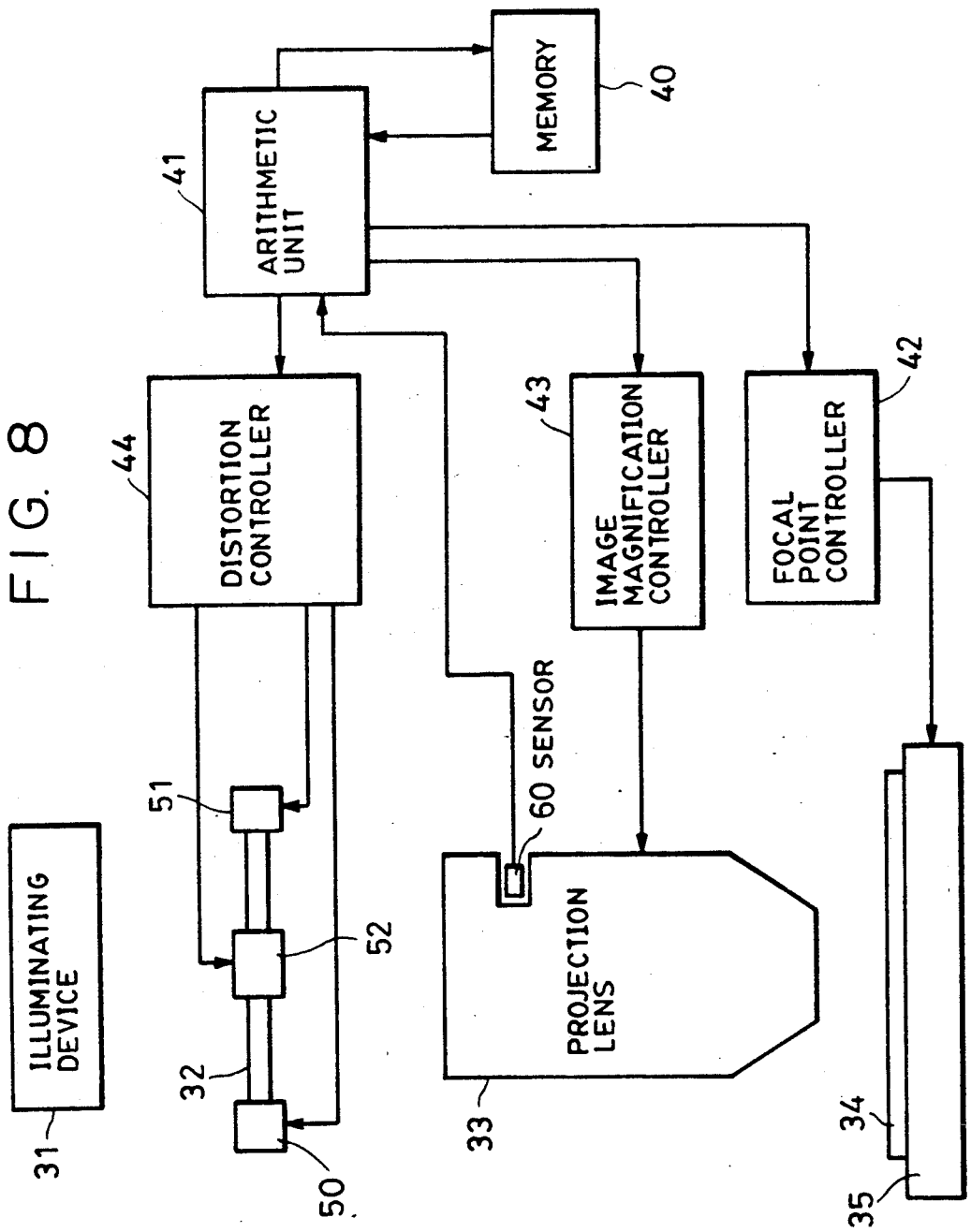
FIG. 8 is a schematic diagram of a second embodiment of a reduced projection exposure apparatus according to the present invention.

FIG. 8 shows a second embodiment of a projection exposure apparatus according to the present invention. This is a schematic view of a reduced projection type exposure apparatus for producing a semiconductor integrated circuit.

The second embodiment differs from the first embodiment in the following points. First, there is provided, as shown in shown in FIG. 8, a temperature sensor 60 in a projection lens 33. An arithmetic unit 41 is connected to a memory 40 which stores first data obtained by measuring the relationship between a symmetrical distortion of the projection lens 33 and the temperature indicated by the sensor 60. The first data is read out by inputting the temperature indicated by the sensor 60 into the memory 40, and the arithmetric unit 44 calculates the above mentioned deviation based on the thus read first data to produce a distortion correction control signal.

Further, the memory 40 stores second and third data which are obtained by measuring a relationship between a shift of a focal point of the projection lens 33 and the temperature and that between a shift of an image magnification of the projection lens 3 and the temperature, respectively. The arithmetic unit 41 reads the second and third data by inputting the temperature indicated by the sensor 60, and produces focal point correction and image magnification correction control signals based on the thus read second and third data.

Also, in the reduced projection exposure apparatus of the second embodiment, the displacement of the focal point, the shift of the image magnification and the symmetrical distortion of the projection lens 3 arise due to the absorption of part of the exposure light by the projection lens 33. The degradation of resolution due to those factors are prevented in this embodiment in the following manner.

(1) Prevention of adverse influences due to displacement of a focal point:

When the exposure is started, the arithmetic unit 41 takes in an output signal of the sensor 60 and inputs into the memory 40 the temperature of the projection lens 33 indicated by the output signal, and the second data stored in the memory 40 (the relationship between displacement of a focal point of the projection lens 33 and temperature indicated by the sensor 60 obtained by measurement) is read. Then, the focal point correction control signal produced based on the read second data is output to the focal point control device 42. The focal point control device 42 moves the stage 35 up and down according to the focal point correction control signal, and adjusts the distance between the projection lens 33 and the stage 35 according to the shift of the focal point of the projection lens 33.

(2) Prevention of adverse influences due to shift of an image magnification:

When the exposure is started, the arithmetic unit 41 takes in an output signal of the sensor 60 and inputs into the memory 40 the temperature of the projection lens 33 indicated by this output signal, and the third data stored in the memory 40 (the relationship between t image magnification of the projection lens 33 obtained by measurement) is read. Then, the image magnification correction control signal produced based on the read third data is output to the image magnification control device 43. The image magnification control device 43 charges the pressure of air in the sealed spaced disposed in the projection lens 33 based on the image magnification correction control signal, and adjusts the pressure of air in the sealed spaced according to the shift of the image magnification of the projection lens 33.

(3) Prevention of adverse influences due to a symmetrical distortion:

When the exposure is started, the arithmetic unit 41 takes in an output signal of the sensor 60 and inputs into the memory 40 the temperature of the projection lens 33 indicated by this output signal, and the first data stored in the memory 40 (the relationship between temperature indicated by the sensor 60 and a symmetrical distortion of the projection lens 33 obtained by measurement) is read. Then, the distortion correction control signal produced based on the read first data is output to the distortion controller 44. The distortion control device 44 outputs control signals to respective driving devices 50-52 (one driving device is not shown in FIG. 8) according to the distortion correction control signal, and deforms the reticle 32 in its surface direction according to the symmetrical distortion of the projection lens 33.

More in particular, the arithmetic unit 41 calculates from the first data read out from the memory 40 the deviation between the original geometric shape (square) of the circuit pattern formed on the reticle 32 and the geometric shape of the pattern image formed on the silicon wafer 34. If a barrel type distortion of the pattern image due to the barrel type distortion of the projection lens 33 (see FIG. 3A) is confirmed, the arithmetic unit 41 produces a distortion correction control signal for instructing that the reticle 32 be deformed into a reel shape as shown in FIG. 6. The distortion control device 44 which receives the thus produced distortion correction control signal outputs control signals to respective driving devices 50-52 for extending the expansible portions by predetermined amounts. On the other hand, if the deviation is calculated based on the first data read from the memory 40 and the reel type distortion of the pattern image due to the reel type distortion of the projection lens 33 (see FIG. 3B) is confirmed, the arithmetric unit 41 produces a distortion correction control signal for instructing that the reticle 32 be deformed into a barrel shape as shown in FIG. 7. The distortion control device 44 which receives the thus produced distortion correction control signal outputs control signals to respective driving devices 50-52 for reducing the expansible portions by predetermined amounts.

As a result, also in this embodiment, even when the barrel-type or reel-type distortion of the pattern image formed on the silicon wafer 34 is created due to the symmetrical distortion of the projection lens 33, the reticle 32 can be deformed in its surface direction and the circuit pattern formed on the reticle 32 can be deformed so that the distortion of the pattern image is eliminated. Thus, the distortion of the pattern image formed on the silicon wafer 34 can be prevented.

The position of the sensor 60 is preferably in the vicinity of the optical axis of an exposure light where influence of the increase of temperature due to exposure appears most greatly. However, since the sensor 60 directly blocks the exposure light and an optical problem occurs if the sensor 60 is disposed in the vicinity of the optical axis, actually places where the influence of the increase of temperature due to exposure appears comparatively greatly are selected in an experimental manner or other manners from peripheral portions of the projection lens 33 where the exposure light does not pass. Since the increase of temperature at the thus selected position of the temperature sensor 60 one-to-one corresponds to each of the shifts in focal point and an image magnification of the projection lens 33 and symmetrical distortion, their relationships are beforehand measured and the abovementioned three data are stored in the memory 40.

In the above-discussed structure, there are provided four driving devices as means for deforming a reticle in its surface direction, and central portions of four sides of a reticle are held by respective driving devices, but the number of driving devices is not limited to four.

Further, there is no need to extend or reduce respective expansible portions by an equal length. They may be extended or reduced by different lengths. This is effective when, for example, a rectangular reticle is used.

Although mechanical means is used in places where portions holding a reticle such as the driving devices shown in FIG. 5 are extended or reduced as means for deforming the reticle in its surface direction, other means may be used, for example, means for deforming a reticle into a desired shape by thermal expansion by controlling positions to which heat is given and its amount.

Figure 9:
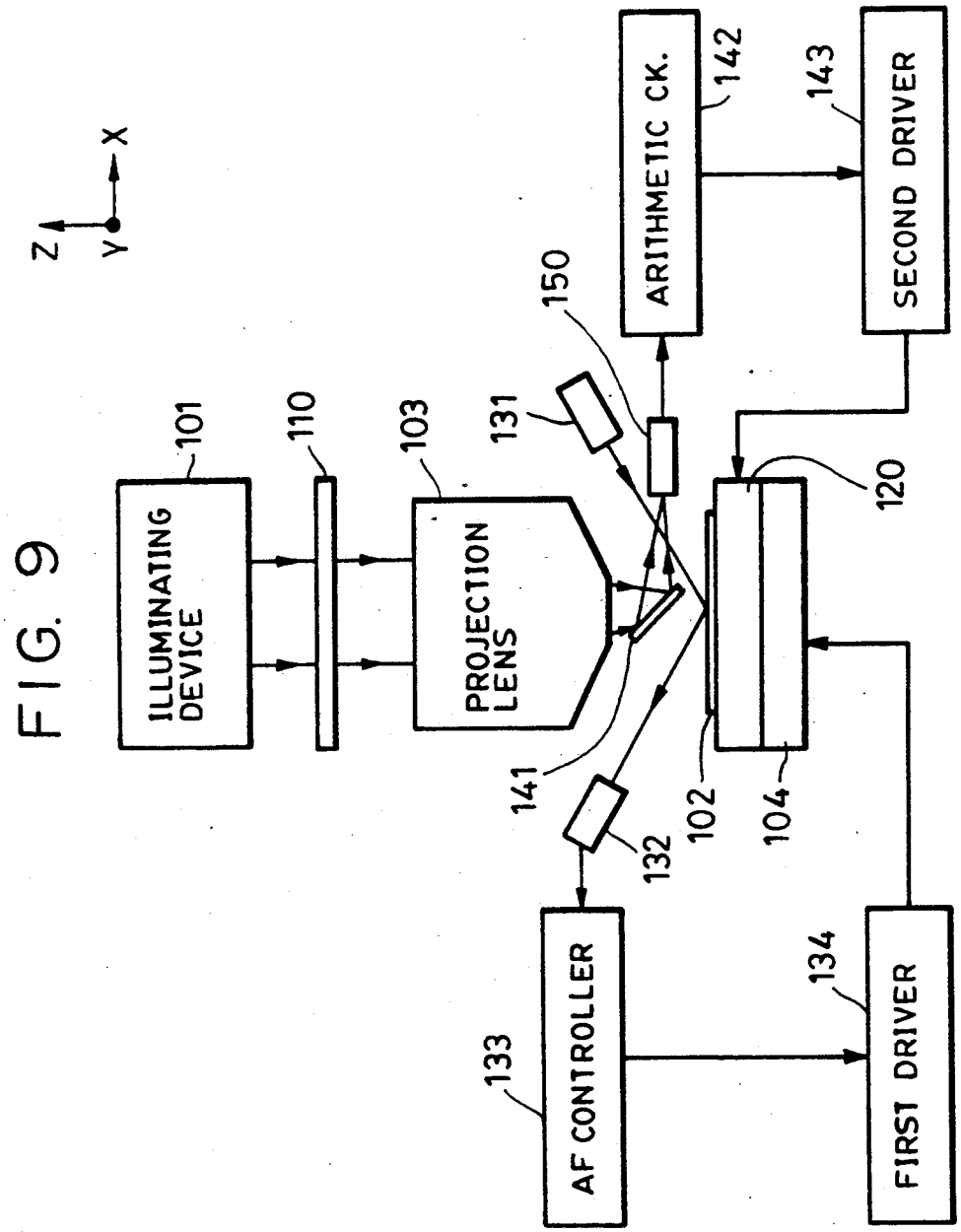
FIG. 9 is a schematic diagram of a third embodiment of a reduced projection exposure apparatus according to the present invention.

FIG. 9 shows a third embodiment of a projection exposure apparatus according to the present invention. This is a schematic view of a reduced projection type exposure apparatus for producing a semiconductor integrated circuit.

The reduced projection exposure apparatus includes an exposure system, an auto-focus system and a curvature-of-field correction system.

In the exposure system, there are provided, as shown in FIG. 9, an illuminating device 101 for emitting an exposure light of ultraviolet light, a reticle 110 or an original having thereon a circuit pattern, a silicon wafer 102 or a substrate on which a pattern image of a reduced image of the circuit pattern is formed, a projection lens 103 disposed between the reticle 110 and the wafer 102 for imaging the circuit pattern onto the silicon wafer 102 at a predetermined reduction ratio, a wafer holder 120 or substrate holder on which the silicon wafer 102 is held by vacuum attraction and a stage 104 movable in X, Y and Z directions and to which the wafer holder 120 is fixed.

Figure 10:
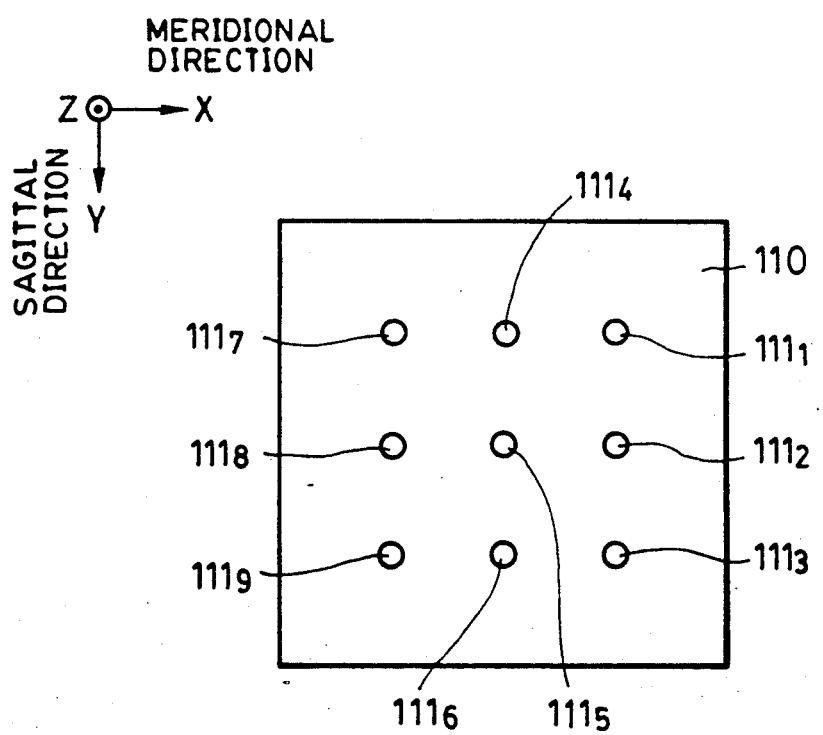
FIG. 10 is a plan view of a reticle shown in FIG. 9 having detection marks thereon.
Figure 11:
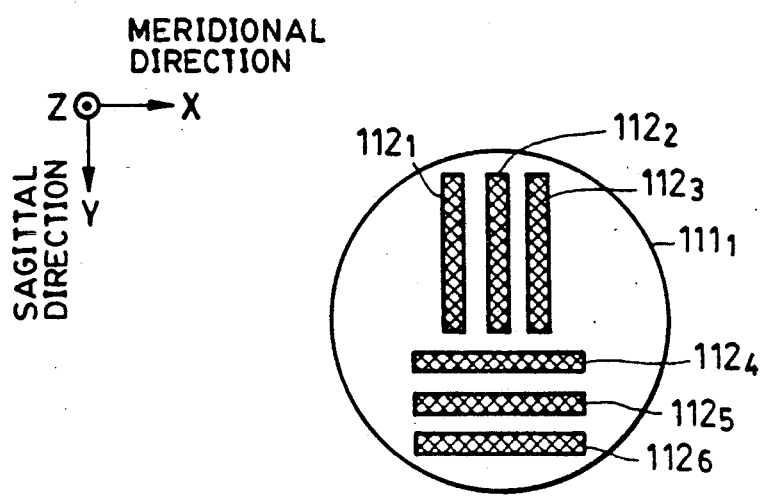
FIG. 11 is a plan view of the detection mark shown in FIG. 10.

As shown in FIG. 10, there are provided on the reticle 110 nine detection marks $111_1$–$111_9$ which are arranged in three rows in respective X (meridional) and Y (sagittal) directions in the circuit pattern (not shown). Further, as shown in FIG. 11, the detection mark $111_1$ includes six bar-charts $112_1$–$112_6$ of about 3.5 μm width consisting of three bar-charts $112_1$–$112_3$ arranged in the meridional direction and three bar-charts $112_4$–$112_6$ arranged in the sagittal direction. The other detection marks $111_2$–$111_9$ are the same as the detection mark $111_1$.

Figure 12A:
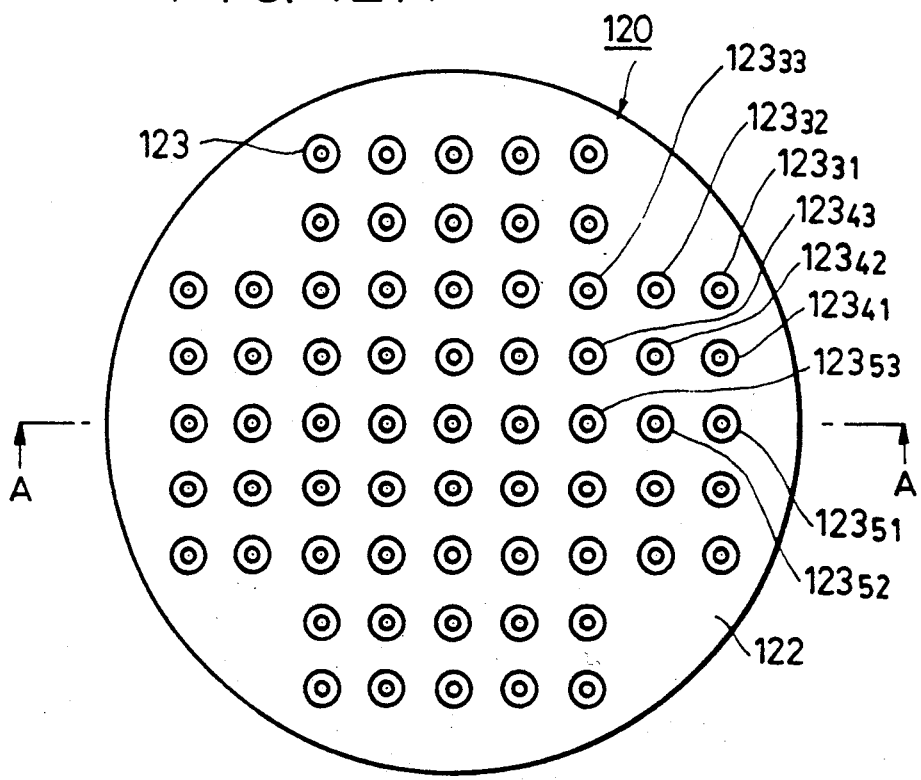
FIG. 12A is a plan view of a wafer holder of the third embodiment.
Figure 12B:
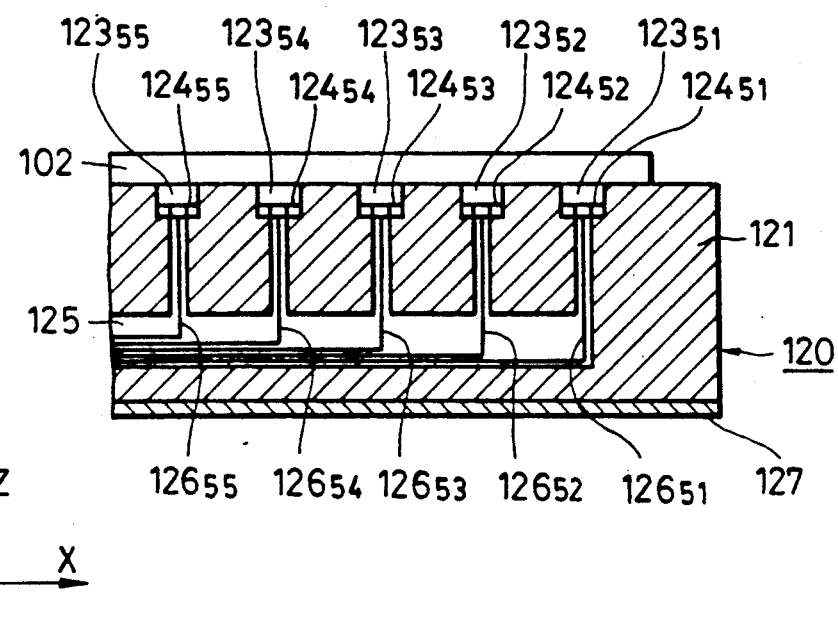
FIG. 12B is a partial cross-sectional view of a wafer holder of the third embodiment taken along a line A—A in FIG. 12A.

As shown in FIG. 12A, there are disposed suction ports 123 for vacuum-attracting the wafer 102 at respective portions of a chuck surface 122 (where the wafer 102 is attracted) in the wafer holder 120 to which the detection marks $111_1$–$111_9$ are transferred. The portions on the central right side in FIG. 12A where nine suction ports $123_{31}$–$123_{33}$, $123_{41}$–$123_{43}$ and $123_{51}$–$123_{53}$ are disposed respectively correspond to portions where nine detection marks $111_1$–$111_9$ are respectively transferred by one shot of exposure. As shown in FIG. 12B, there are provided in a body 121 of the wafer holder 120 an exhaust pipe 125 which is divided to connect each suction port $123_{51}$–$123_{55}$ to a vacuum source (not shown). The wafer 102 is attraction-held by the wafer holder 120 with its bottom surface being vacuum-attracted by the vacuum source. Further, in order to displace the portions of the wafer 102 where the detection marks $111_1$–$111_9$ are transferred in the Z direction (a direction perpendicular to the exposure surface of the wafer 102) to curve the exposure surface of the wafer 102, the wafer holder 120 has the following structure.

First, the body 121 of the wafer holder 120 is made of piezoelectric material such as PZT ceramic or the like.

As shown in FIG. 12B, annular address electrodes $124_{51}$–$124_{55}$ having the same outer diameters as those of the suction ports $123_{51}$–$123_{55}$ are fixed to bottom surfaces of the suction ports $123_{51}$–$123_{55}$.

Leads $126_{51}$–$126_{55}$ are guided in the exhaust pipe 125 to connect the respective address electrodes $124_{51}$–$124_{55}$ with a second driving circuit 143 (see FIG. 9).

A common electrode 127 is fixed to an entire bottom surface of the body 121.

For example, when a voltage applied to the address electrode $124_{51}$ by the second driver 143 through the lead $126_{51}$ is changed, a portion of the body 121 between the address electrode $124_{51}$ and the common electrode 127 is extended or reduced according to the change of the voltage and a portion of the wafer 102 which is vacuum-attracted to the suction port $123_{51}$ is displaced in the Z direction.

The auto-focus system adopts a conventional off-axis system. As shown in FIG. 9, there are provided a projection optical device 131 for projecting non-exposure light on the exposure surface of the wafer 102 vacuum-attracted by the wafer holder 120, a reception optical device 132 for receiving the non-exposure light reflected by the exposure surface of the wafer 102, and AF control device 133 for detecting a positional shift of the wafer 102 in the Z direction based on an output signal of the reception optical device 132 and a first driving circuit 134 for moving the stage 104 in the Z direction according to an output signal of the AF control device 133.

The curvature-of-field correcting system includes an image-surface measuring means and a second driving circuit 143. The image-surface measuring means measures image surfaces of the respective detention marks $111_1$–$111_9$ formed on the reticle 110 by the exposure light passing through the projection lens 103, and consists of a reflection mirror 141, a light receiving 150 and an arithmetric circuit 142. The second driving circuit 143 is a driving means for driving the curving means for curving the wafer holder 120 based on the respective positions of image surfaces of the detection marks $111_1$–$111_9$ measured by the image surface measuring means.

The reflection mirror 141 is disposed between the projection lens 103 and the wafer 102 at the time of an image surface measurement, and reflects the exposure light passing through the projection lens 103 at right angles to be incident on the light receiving device 150.

As shown in FIG. 13, the light receiving means 150 includes a stationary base 159, a fine stage 158 mounted to the stationary base 159 slidable in the optical axial direction (the X direction) of the exposure light reflected by the reflection mirror 141, a microscope 157 mounted on the fine stage 158 for receiving the reflected exposure light, a light receiving plate 151 for receiving the exposure light passing through the microscope 157, an actuator 155 for moving the light receiving plate 151 in the optical axial direction by moving the fine stage 158 in the same direction and a laser linear encoder 156 for detecting the position of the light receiving plate 151 in the optical axial direction mounted to the stationary base 159.

Figure 14:
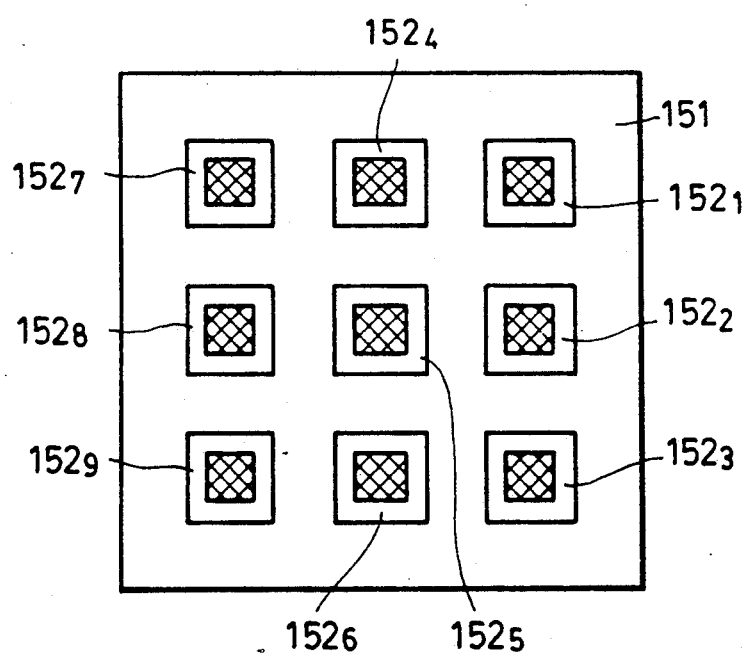
FIG. 14 is a plan view illustrating an arrangement of image sensors of a light receiving plate shown in FIG. 13.

As shown in FIG. 14, there are provided nine CCD image sensors $152_1$–$152_9$ at positions where the sensors can receive the exposure light which is reflected by the reflection mirror 141, passes through the microscope 157 and transmits through the detection marks $111_1$–$111_9$. The microscope 157 is disposed for enlarging the detection marks $111_1$–$111_9$ (see FIG. 10) which consist of the six bar-charts $112_1$–$112_6$ of about 3.5 μm width to a size which can be detected by the CCD image sensors $152_1$–$152_9$.

Figure 15:
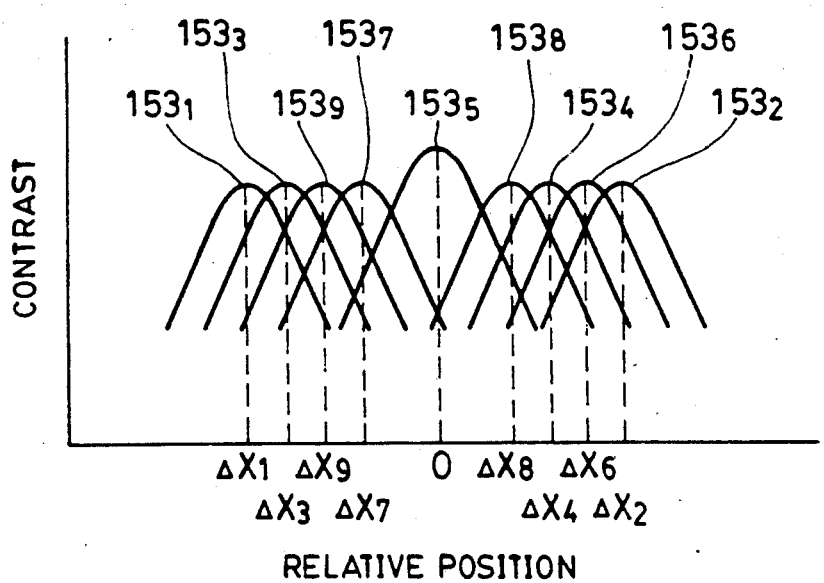
FIG. 15 is a graph illustrating an example of contrast profiles obtained by a difference detection circuit shown in FIG. 9.

The arithmetric circuit 142 (see FIG. 9) functions as arithmetric means for measuring the positions of image surfaces of the detection marks $111_1$–$111_9$ form outputs of the laser linear encoder 156 and the CCD image sensors $152_1$–$152_9$ and outputting differences between the position of an image surface of a reference detention mark (detection mark $111_5$) of one of the detection marks $111_1$–$111_9$ and positions of image surfaces of the other detection marks $111_1$–$111_4$, $111_6$–$111_9$. Namely, the arithmetric circuit 142 calculates the contrast of the detection mark $111_5$ at respective positions in the optical axial direction of the light receiving plate 151 from outputs of the laser linear encoder 156 and the CCD image sensor $152_5$, and obtains a contrast profile of the reference detection mark $111_5$ as shown by a line $153_5$ in FIG. 15. The arithmetric circuit 142 memorizes a position of the light receiving plate 151 where the contrast is maximum as an image position of the reference detection mark $111_5$. Similarly, contrast profiles as shown by lines $153_1$–$153_4$, $153_6$–$153_9$ in FIG. 15 are obtained from outputs of the laser linear encoder 156 and the remaining CCD image sensors $152_1$–$152_4$, $152_6$–$152_9$, and respective positions of the light receiving plate 151 were the contrast is maximum are adopted as respective image surfaces. Differences $\Delta X_1$–$\Delta X_4$, $\Delta X_6$–$\Delta X_9$ are thus obtained from positions of the respective image surfaces and the image surface of the reference detection mark.

Here, the respective contrast profiles can be calculated from light amounts in bright and dark parts of the detection marks $111_1$–$111_9$ received by the respective CCD image sensors $152_1$–$152_9$.

The operation of the third embodiment will be explained referring to FIG. 9.

In the reduced projection exposure apparatus of the third embodiment, and exposure is conducted following operation processes as described below.

(1) A curvature-of-field correction operation for preventing degradation of resolution due to variations in curvature of field of the projection lens 103.

(2) An auto-focus operation for aligning an exposure surface of the wafer 102 with a focal point of the projection lens 103.

(3) An exposure operation for transferring a circuit pattern formed on the reticle 110 to the wafer 102.

The auto-focus operation of (2) and the exposure operation of (3) are the same as conventional ones, so only the curvature-of-field correction operation of (1) will be explained.

When the curvature-of-field correction operation is started, an ultraviolet light of exposure light is radiated from the illuminating device 101 after the reflection mirror 141 is disposed between the projection lens 103 and the wafer 102. The exposure light is reflected at right angles by the reflection mirror 141 to be incident on the light receiving device 150, but only part of the exposure light passing through the detection marks $111_1$–$111_9$ formed on the reticle 110 (see FIG. 10) is received by the CCD image sensors $152_1$–$152_9$ formed on the light receiving plate 151 of the light receiving device 150 (see FIG. 14). The light receiving plate 151 is moved in the X direction in FIG. 9 by the actuator 155 while its position is detected by the laser linear encoder 156 (see FIG. 13). The arithmetic circuit 142 obtains the differences $\Delta X_1$–$\Delta X_4$, $\Delta X_6$–$\Delta X_9$ between the image surface position of the reference detection mark $111_5$ and the image surface positions of the remaining detection marks $111_1$–$111_4$, $111_6$–$111_9$ from the respective contrast profiles shown by the lines $153_1$–$153_9$ in FIG. 15 calculated from outputs of the laser linear encoder 156 and the CCD image sensors $152_1$–$152_9$. The differences are output into the second driving circuit 143.

Here, consider a case wherein an area of the wafer holder 120 shown in FIG. 12A including nine suction ports $123_{31}$–$123_{33}$, $123_{41}$–$123_{43}$, $123_{51}$–$123_{53}$ is exposed and the differences $\Delta X_1$–$\Delta X_4$, $\Delta X_6$–$\Delta X_9$ other than three differences $\Delta X_3$, $\Delta X_6$, $\Delta X_9$ obtained by the arithmetic circuit 142 are zero. In this case, the second driving circuit 143 outputs voltages corresponding to the respective differences $\Delta X_3$, $\Delta X_6$, $\Delta X_9$ to three leads $126_{51}$, $126_{52}$, $126_{53}$. At this time, portions of the body 121 of the wafer holder 120 where three suction ports $123_{51}$, $123_{52}$, $123_{53}$ are extended or reduced according to changes of the voltages applied between three address electrodes $124_{51}$, $124_{52}$, $124_{53}$ to which the leads $126_{51}$, $126_{52}$, $126_{53}$ are connected and the common electrode 127. Thus, portions of the wafer 102 vacuum-attracted to the chuck surface 122 of the wafer holder 120 are displaced in a direction perpendicular to the exposure surface of the wafer 102, and hence the exposure surface of the wafer 102 is curved so that the shift of curvature of field of the projection lens 103 is compensated for.

After the above-discussed curvature-of-field correction operation is completed, the auto-focus operation of the above-noted (2) is performed to align the exposure surface of the wafer 102 with the focal point of the projection lens 103. Then, the exposure operation of the above-noted (3) is conducted to transfer the circuit pattern formed on the reticle 110 onto an area of the wafer 102 vacuum-attracted by the suction ports $123_{31}$–$123_{33}$, $123_{41}$–$123_{43}$, $123_{51}$–$123_{53}$.

When an ideal imaging performance should always be obtained even if throughput is lowered a little, the above-noted operations (1)–(3) are repeated each time the exposure area is changed by moving the stage 104 in the X and Y directions in FIG. 9. On the other hand, when the increase of throughput is desired even if the imaging performance is a little sacrificed, only the above-noted operation (3) is repeated to transfer the circuit pattern onto an entire surface of the wafer 102 after the curvature-of-field correction operation (1) and the auto-focus operation (2) are completed.

Figure 16:
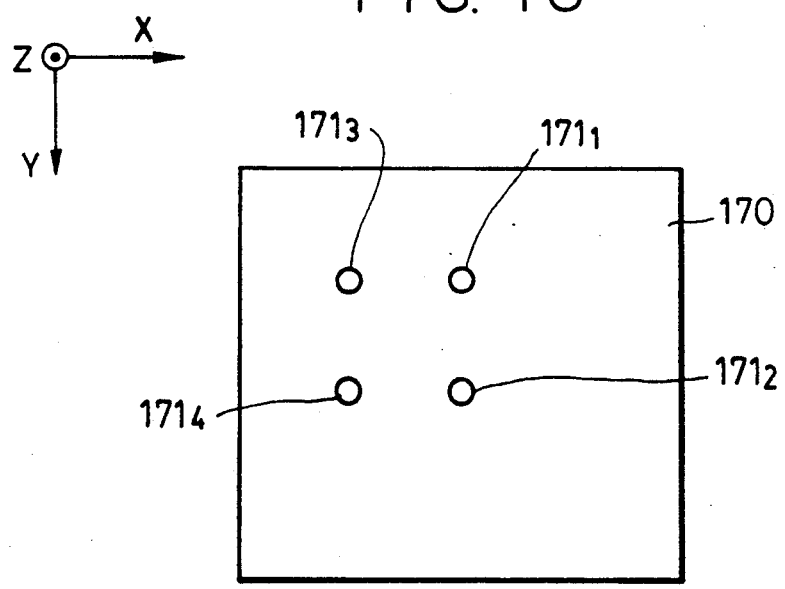
FIG. 16 is a plan view illustrating another example of an arrangement of detection marks formed on a reticle.

FIG. 16 shows another arrangement of detection marks formed on a reticle.

Figure 17:
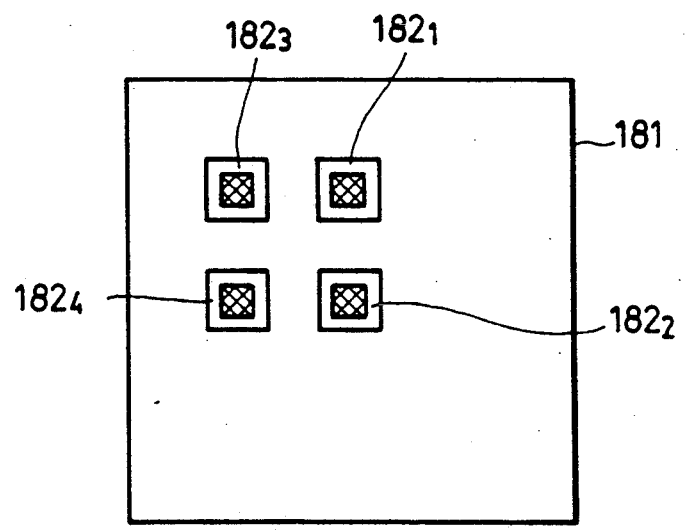
FIG. 17 is a plan view illustrating another example of an arrangement of image sensors formed on a light receiving plate to be used when the reticle of FIG. 16 is used.

Although nine detection marks $111_1$–$111_9$ are formed on the reticle 110 to detect the curvature of field of the projection lens 103 in the embodiment shown in FIG. 9, nine detection marks are not necessarily required. For example, when the curvature of field of the projection lens 103 is approximately deemed to have a symmetry of 90 degrees with respect to rotation, it is sufficient to form four detection marks $171_1$–$171_4$ on the side area of a reticle 170 as shown in FIG. 16 to detect the curvature of field. In this case, the number of CCD image sensors $182_1$–$182_4$ formed on a light receiving plate 181 for detecting the image surface positions of the detection marks $171_1$–$171_4$ may be four as shown in FIG. 17, so that the processing in the arithmetric circuit 142 becomes easy and hence throughput can be improved.

Figure 18A:
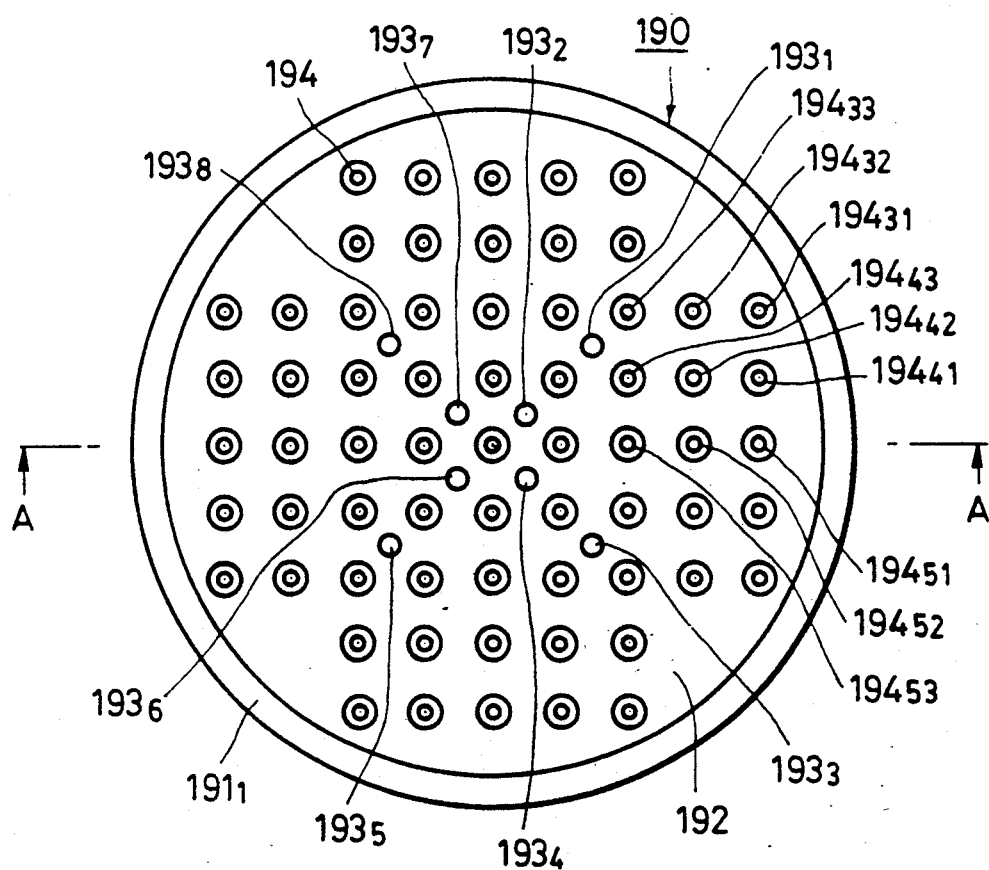
FIG. 18A is a plan view of a wafer holder of a fourth embodiment of the present invention.
Figure 18B:
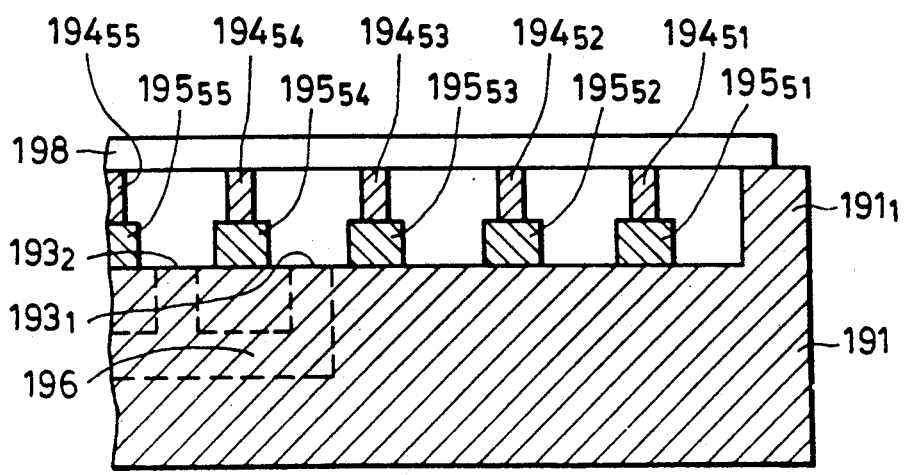
FIG. 18B is a partial cross-sectional view of a wafer holder of the fourth embodiment taken along a line A—A in FIG. 12A.

FIGS. 18A and 18B show another structure of a wafer holder.

In a wafer holder 190 of FIGS. 18A and 18B, a body 191 is made of material of great rigidity and has a outer peripheral wall $191_1$, and pins 194 of a rod-like metal are provided on portions of a chuck surface 192 where the detection marks $111_1$–$111_9$ are transferred. A wafer 198 is attracted and held with its bottom surface being in contact with the outer peripheral wall $191_1$ and the pins 194. In order to vacuum-attract the wafer 198, there is provided in the body 191 an exhaust pipe 196 for connecting eight suction ports $193_1$–$193_8$ symmetrically disposed at a central portion of the chuck surface 192 with a vacuum source (not shown).

Further, there are provided between the pins 194 and the chuck surface 192 actuators $195_{51}$–$195_{55}$ such as piezo elements which are finely displaceable for acting as curving means for curving the exposure surface of the wafer 198 to eliminate the curvature of field of the projection lens 103, as shown in FIG. 18B.

Next, a curvature-of-field correction operation will be explained in a case wherein the wafer holder 120 of FIGS. 12A and 12B is replaced by the wafer holder 190 in the projection exposure apparatus of FIG. 9.

In this projection exposure apparatus, the actuators $195_{51}$–$195_{55}$ are connected to the second driving circuit 143 of FIG. 9 through leads (not shown), and their displacements are controlled by the second driving circuit 143.

When the curvature-of-field correction operation is started, an ultraviolet light of exposure light is radiated from the illuminating device 101 after the reflection mirror 141 is disposed between the projection lens 103 and the wafer 198. The exposure light is reflected at right angles by the reflection mirror 141 to be incident on the light receiving device 150, but only part of the exposure light passing through the detection marks $111_1$–$111_9$ formed on the reticle 110 (see FIG. 10) is received by the CCD image sensors $152_1$–$152_9$ formed on the light receiving plate 151 of the light receiving device 150 (see FIG. 14). The light receiving plate 151 is moved in the X direction in FIG. 9 by the actuator 155 while its position is detected by the laser linear encoder 156 (see FIG. 13). The arithmetric circuit 142 obtains the differences $\Delta X_1$–$\Delta X_4$, $\Delta X_6$–$\Delta X_9$ between the image surface position of the reference detection mark $111_5$ and the image surface positions of the remaining detection marks $111_1$–$111_4$, $111_6$–$111_9$ from the respective contrast profiles shown by the lines $153_1$–$153_9$ in FIG. 15 calculated from outputs of the linear encoder 156 and the CCD image sensors $152_1$–$152_9$. The differences are output into the second driving circuit 143.

Here, consider a case wherein an area of the wafer holder 190 shown in FIG. 18A including nine pins $194_{31}$–$194_{33}$, $194_{41}$–$194_{43}$, $194_{51}$–$194_{53}$ is exposed and the differences $\Delta X_1$–$\Delta X_4$, $\Delta X_6$–$\Delta X_9$ other than three differences $\Delta X_3$, $\Delta X_6$, $\Delta X_9$ obtained by the arithmetric circuit 142 are zero. In this case, the second driving circuit 143 outputs voltages corresponding to the respective differences $\Delta X_3$, $\Delta X_6$, $\Delta X_9$ to three actuators $195_{51}$, $195_{52}$, $195_{53}$ shown in FIG. 18B. At this time, the actuators $195_{51}$, $195_{52}$, $195_{53}$ are extended or reduced according to changes of the voltages and portions of the wafer holder 190 which are in contact with three pins $194_{51}$, $194_{52}$, $194_{53}$ are displaced in a direction perpendicular to the exposure surface. Thus, the exposure surface of the wafer 198 is curved so that the shift of curvature of field of the projection lens 103 is compensated for.

In the above-discussed embodiments, the laser linear encoder 156 is used to detect the position of the light receiving plate 151, but a laser interferometer may be used to improve accuracy of detection.

The present invention can be applied to any type of projection exposure apparatus in which a pattern formed on and original is imaged onto a substrate at a predetermined ratio to form a pattern image on a substrate using a projection lens disposed between the original and the substrate.

While there have been shown and described what are considered preferred embodiments of the present invention, it will be apparent to those skilled in the art that various changes and modifications may be made therein without departing from the invention as defined by the following claims.

What is claimed is:

1. A projection exposure apparatus in which a pattern formed on an original is imaged onto a substrate at a predetermined magnification to form a pattern image on the substrate, said apparatus comprising:

first support means for supporting the original;

second support means for supporting the substrate;

a projection lens disposed between said first and second support means for imaging the pattern onto the substrate;

deforming means for deforming the original in its surface direction;

arithmetric means for calculating a deviation between an original geometric shape of the pattern formed on the original and a geometric shape of the pattern image formed on the substrate; and control means for controlling said deforming means bases on the deviation calculated by said arithmetric means so that the geometric shape of the pattern image coincides with the original geometric shape of the pattern.

2. A projection exposure apparatus according to claim 1, wherein said arithmetic means comprises a memory for storing data which are obtained by measuring a relationship between a symmetrical distortion of the projection lens and time elapsed from a start of exposure, and a timer for measuring the time elapsed from the start of exposure, and wherein said arithmetric means reads the data by inputting into said memory the time measured by said timer and calculates based on the read data the deviation between the original geometric shape of the pattern formed on the original and the geometric shape of the pattern image formed on the substrate.

3. A projection exposure apparatus according to claim 1, wherein said arithmetric means comprises a temperature sensor disposed at the projection lens and a memory for storing data which are obtained by measuring a relationship between a symmetrical distortion of the projection lens and temperature indicated by said sensor, and wherein said arithmetric means reads the data by inputting into said memory the temperature indicated by said sensor and calculates based on the read data the deviation between the original geometric shape of the pattern formed on the original and the geometric shape of the pattern image formed on the substrate.

4. A projection exposure apparatus in which a pattern formed on an original is imaged onto a substrate at a predetermined magnification to form a pattern image on the substrate, said apparatus comprising:

first support means for supporting the original;
second support means for supporting the substrate;
a projection lens disposed between said first and second support means for imaging the original onto the substrate;
measuring means for measuring respective positions of image surfaces of plural detection marks formed on the original by use of an exposure light transmitted through said projection lens;
curving means for curving an exposure surface of the substrate by displacing portions of the substrate when the detection marks are transferred in a direction perpendicular to an exposure surface of the substrate; and
driving means for driving said curving means based on the respective positions of image surfaces of the detection marks measured by said measuring means.

5. A projection exposure apparatus according to claim 4, wherein said measuring means comprises a reflection mirror to be interposed between the projection lens and the substrate at a time of measuring the positions of image surfaces of the detection marks for reflecting the exposure light transmitted through the projection lens at right angles, light receiving means for receiving exposure light transmitted through the detection marks out of the exposure light reflected by the reflection lens, moving means for moving the light receiving means in a direction of an optical axis of the exposure light reflected by the reflection mirror, detection means for detecting the position of the light receiving means in the direction of the optical axis, arithmetic means for measuring the positions of image surfaces of the detection marks based on outputs of said light receiving means and said detection means and outputting to said driving means differences between the position of an image surface of a reference detection mark of one of the detection marks and the positions of image surfaces of the other detection marks.

6. A method for imaging a pattern formed on an original onto a substrate at a predetermined magnification to form a pattern image on the substrate using a projection lens in a projection exposure apparatus, said method comprising the steps of:

measuring a manner of change of a symmetrical distortion of the projection lens;
calculating a deviation between an original geometric shape of the pattern formed on the original and a geometric shape of the pattern image formed on the substrate based on the manner of change of the symmetrical distortion of the projection lens measured in said measuring step;
deforming the original in its surface direction based on the deviation calculated in said calculating step so that the geometric shape of the pattern image coincides with the original geometric shape of the pattern on the original; and
imaging the pattern on the original onto the substrate using an exposure light transmitted through the projection lens.

7. A method for imaging a pattern formed on an original onto a substrate at a predetermined magnification to form a pattern image on the substrate using a projection lens in a projection exposure apparatus, said method comprising the steps of:

providing plural detection marks on the original;
measuring respective positions of image surfaces of the plural detection marks formed on the original by use of an exposure light transmitted through the projection lens to detect a curvature of field of the projection lens;
curving an exposure surface of the substrate by displacing portions of the substrate when the detection marks are transferred in a direction perpendicular to the exposure surface of the substrate based on the respective image surfaces of the direction marks measured in said measuring step to compensate for the curvature of field of the projection lens; and
imaging the pattern on the original onto the substrates using the exposure light transmitted through the projection lens.

8. A semiconductor device manufacturing method comprising the steps of:

preparing a reticle and a wafer;
measuring a manner of change of a symmetrical distortion of a projection lens in a projection exposure apparatus;
calculating a deviation between an original geometric shape of the pattern formed on the reticle and a geometric shape of the pattern image formed on the wafer based on the manner of change of the symmetrical distortion of the projection lens measured in said measuring step;
deforming the reticle in its surface direction based on the deviation calculated in said calculating step so that the geometric shape of the pattern on the reticle; the original geometric shape of the pattern in the reticle; and
imaging the pattern on the reticle onto the wafer using an exposure light transmitted through the projection lens.

9. A semiconductor device manufactured by a method comprising the steps of:

preparing a reticle and a wafer;
measuring a manner of change of a symmetrical distortion of a projection lens in a projection exposure apparatus;
calculating a deviation between an original geometric shape of the pattern formed on the reticle and a geometric shape of the pattern image formed on the wafer based on the manner of change of the symmetrical distortion of the projection lens measured in said measuring step;
deforming the reticle in its surface direction based on the deviation calculated in said calculating step so that the geometric shape of the pattern image coincides with the original geometric shape of the pattern on the reticle; and
imaging the pattern on the reticle onto the wafer using an exposure light transmitted through the projection lens.

10. A semiconductor device manufacturing method comprising the steps of:

preparing a reticle having plural detection marks and a wafer;
measuring respective positions of image surfaces of the plural detection marks formed on the reticle by use of an exposure light transmitted through a projection lens in a projection exposure apparatus to detect a curvature of field of the projection lens;
curving an exposure surface of the wafer by displacing portions of the wafer where the detection marks are transferred in a direction perpendicular to the exposure surface of the wafer based on the respective image surfaces of the detection marks measured in said measuring step to compensate for the curvature of field of the projection lens; and imaging the pattern on the reticle onto the wafer using the exposure light transmitted through the projection lens.

11. A semiconductor device manufactured by a method comprising the steps of:

preparing a reticle having plural detection marks and a wafer;

measuring respective positions of image surfaces of the plural detection marks formed on the reticle by use of an exposure light transmitted through a projection lens in a projection exposure apparatus to detect a curvature of field of the projection lens;

curving an exposure surface of the wafer by displacing portions of the wafer where the detection marks are transferred in a direction perpendicular to the exposure surface of the wafer based on the respective image surfaces of the detection marks measured in said measuring step to compensate for the curvature of field of the projection lens; and imaging the pattern on the reticle onto the wafer using the exposure light transmitted through the projection lens.

* * * * *

UNITED STATES PATENT AND TRADEMARK OFFICE
CERTIFICATE OF CORRECTION

PATENT NO. : 5,184,176               Page 1 of 6
DATED      : February 2, 1993
INVENTOR(S): Yasuyuki Unno, et al.

It is certified that error appears in the above-indentified patent and that said Letters Patent is hereby corrected as shown below:

IN THE ABSTRACT

Line 1, "projective" should read --projection--.

COLUMN 1

Line 55, "time $_1$." should read --time $t_1$.--.

COLUMN 2

Line 28, "be" should be deleted.

COLUMN 3

Line 30, "position of" should read --positions of portions of--;
    Line 45, "arithmetric" should read --arithmetic--;
    Line 50, "arithmetric" should read --arithmetic--; and
    Line 52, "coincide" should read --coincides--.

UNITED STATES PATENT AND TRADEMARK OFFICE
CERTIFICATE OF CORRECTION

PATENT NO. : 5,184,176
DATED : February 2, 1993
INVENTOR(S) : Yasuyuki Unno, et al.

It is certified that error appears in the above-indentified patent and that said Letters Patent is hereby corrected as shown below:

COLUMN 6

Line 35, "pattern coincide" should read --pattern image to coincide--; and
    Line 43, "e" should be deleted.

COLUMN 7

Line 38, "are" should read --is--;
    Line 42, "arithmetric" should read --arithmetic--; and
    Line 57, "arithmetric" should read --arithmetic--.

COLUMN 8

Line 4, "die" should read --due--;
    Line 6, "arithmetric" should read --arithmetic--;
    Line 19, "arithmetric" should read --arithmetic--;
    Line 27, "arithmetric" should read --arithmetic--; and
    Line 38, "arithmetric" should read --arithmetic--.

UNITED STATES PATENT AND TRADEMARK OFFICE
CERTIFICATE OF CORRECTION

PATENT NO. : 5,184,176
DATED : February 2, 1993
INVENTOR(S) : Yasuyuki Unno, et al.

It is certified that error appears in the above-indentified patent and that said Letters Patent is hereby corrected as shown below:

COLUMN 9

Line 7, "arithmetric" should read --arithmetic--;
Line 8, "44 calculates" should read --41 calculates--;
Line 16, arithmetric" should read --arithmetic--;
Line 27, "are" should read --is--;
Line 31, "arithmetric" should read --arithmetic--;
Line 48, "arithmetric" should read --arithmetic--;
Line 52, "between t image" should read --between temperature indicated by the sensor 60 and a shift of an image--; and
Line 65, "arithmetric" should read --arithmetic--.

COLUMN 10

Line 12, "arithmetric" should read --arithmetic--;
Line 19, "arithmetric" should read --arithmetic--; and
Line 32, "metric" should read --metic--.

UNITED STATES PATENT AND TRADEMARK OFFICE
CERTIFICATE OF CORRECTION

PATENT NO. : 5,184,176            Page 4 of 6
DATED : February 2, 1993
INVENTOR(S) : Yasuyuki Unno, et al.

It is certified that error appears in the above-indentified patent and that said Letters Patent is hereby corrected as shown below:

COLUMN 11

Line 10, "reduced" should read --reduced,--.

COLUMN 12

Line 27, "and" should read --an--;
Lines 35 through 47, the left margins should be closed up;
Line 38, "detention" should read --detection--;
Line 41, "150" should read --device 150-- and "arithmetric" should read --arithmetic--; and
Line 55, "slidable" should read --slidably--.

COLUMN 13

Line 9, "arithmetric" should read --arithmetic--;
Line 10, "arithmetric" should read --arithmetic--;
Line 11, "form" should read --from--;
Line 14, "detention" should read --detection--;
Line 24, "arithmetric" should read --arithmetic--;
Line 31, "were" should read --where--; and
Line 43, "and" should read --an--.

UNITED STATES PATENT AND TRADEMARK OFFICE
CERTIFICATE OF CORRECTION

PATENT NO. : 5,184,176  Page 5 of 6
DATED : February 2, 1993
INVENTOR(S) : Yasuyuki Unno, et al.

It is certified that error appears in the above-indentified patent and that said Letters Patent is hereby corrected as shown below:

COLUMN 14

Line 19, "metric" should read --metic--;

COLUMN 15

Line 1, "arithmetric" should read --arithmetic--;
    Line 46, "arithmetric" should read --arithmetic--; and
    Line 59, "arithmetric" should read --arithmetic--.

COLUMN 16

Line 9, "and" should read --an--;
    Line 32, "arithmetric" should read --arithmetic--;
    Line 36, "bases" should read --based--;
    Line 38, "ric" should read --ic--;
    Line 46, "arithmetric" should read --arithmetic--;
    Line 55, "arithmetric" should read --arithmetic--; and
    Line 60, "arithmetric" should read --arithmetic--.

UNITED STATES PATENT AND TRADEMARK OFFICE
CERTIFICATE OF CORRECTION

PATENT NO. : 5,184,176
DATED : February 2, 1993
INVENTOR(S) : Yasuyuki Unno, et al.

It is certified that error appears in the above-indentified patent and that said Letters Patent is hereby corrected as shown below:

COLUMN 17

Line 34, "arithmetric" should read --arithmetic--; and
    Line 68, "original:" should read --original;--.

COLUMN 18

Line 31, "pattern on the reti-" should read --pattern image coincides with--; and
    Line 32, "cle;" should be deleted, and "in" should read --on--.

Signed and Sealed this

Twenty-second Day of March, 1994

Attest:

BRUCE LEHMAN

*Attesting Officer*     *Commissioner of Patents and Trademarks*